United States Patent
Ivrii et al.

(10) Patent No.: US 9,454,466 B2
(45) Date of Patent: Sep. 27, 2016

(54) EXPLAINING PARTIALLY ILLEGAL COMBINATIONS IN COMBINATORIAL MODELS

(71) Applicant: GLOBALFOUNDRIES U.S.2LLC, Hopewell Junction, NY (US)

(72) Inventors: Alexander Ivrii, Haifa (IL); Itai Segall, Tel-Aviv (IL); Rachel Tzoref-Brill, Haifa (IL)

(73) Assignee: GLOBALFOUNDRIES INC., Grand Cayman (KY)

( * ) Notice: Subject to any disclaimer, the term of this patent is extended or adjusted under 35 U.S.C. 154(b) by 380 days.

(21) Appl. No.: 14/043,864

(22) Filed: Oct. 2, 2013

(65) Prior Publication Data

US 2015/0094997 A1  Apr. 2, 2015

(51) Int. Cl.
- *G06F 7/60* (2006.01)
- *G06F 17/10* (2006.01)
- *G06F 11/36* (2006.01)
- *G06F 17/50* (2006.01)

(52) U.S. Cl.
CPC ......... *G06F 11/3684* (2013.01); *G06F 17/504* (2013.01)

(58) Field of Classification Search
CPC .......................... G06F 17/504; G06F 11/3684
USPC ............................................................. 703/2
See application file for complete search history.

(56) References Cited

U.S. PATENT DOCUMENTS

| 7,992,113 | B1 | 8/2011 | Goldberg |
| 8,108,195 | B2 | 1/2012 | Geist et al. |
| 8,121,827 | B2 | 2/2012 | Azatchi et al. |
| 2010/0324881 | A1* | 12/2010 | Geist ...................... G06F 17/504 703/15 |
| 2012/0317454 | A1 | 12/2012 | Krenz-Baath et al. |
| 2012/0324414 | A1 | 12/2012 | Tzoref-Brill et al. |

OTHER PUBLICATIONS

Oded Lachish, Eitan Marcus, Shmuel Ur, Avi Ziv, "Hole Analysis for Functional Coverage Data"DAC 2002 Jun. 10-14, 2002, ACM, 6 pages.*

Shakya et al., "Isolating Failure-Inducing Combinations in Combinatorial Testing Using Test Augmentation and Classification", IEEE Fifth International Conference on Software Testing, Verification and Validation (ICST), 2012, pp. 620-623.

Jussila et al., "Extended Resolution Proofs for Symbolic SAT Solving with Quantification", SAT'06 Proceedings of the 9th international conference on Theory and Applications of Satisfiability Testing, 2006, pp. 54-60.

(Continued)

*Primary Examiner* — Dwin M Craig
(74) *Attorney, Agent, or Firm* — Yuanmin Cai, Esq.

(57) ABSTRACT

A methods, apparatus and product for explaining partially illegal combinations in combinatorial models. The method comprising: obtaining a combinatorial model defining a legal test space, the combinatorial model comprising a set of attributes, a respective domain for each attribute defining possible values for the attribute, and a set of restrictions, wherein the restrictions define a combination of values of the attributes that are illegal and are excluded from the legal test case; obtaining a partially illegal combination defining value assignments to a portion of the attributes; automatically identifying an extension of the partially illegal combination, wherein the extension is excluded from the legal test space, wherein the extension can be modified to become legal by changing a portion of the value assignments defined by the partially illegal combination; and outputting the extension.

9 Claims, 4 Drawing Sheets

(56) References Cited

OTHER PUBLICATIONS

Zhang et al., "Validating SAT solvers using an independent resolution-based checker: practical implementations and other applications", DATE '03 Proceedings of the conference on Design, Automation and Test in Europe—vol. 1, 2003.

Chatterjee et al., "On Resolution Proofs for Combinational Equivalence", DAC '07 Proceedings of the 44th annual Design Automation Conference, pp. 600-605, 2007.

Een et al., "Temporal Induction by Incremental SAT Solving", Electronic Notes in Theoretical Computer Science, vol. 89, Issue 4, 2003, pp. 543-560.

\* cited by examiner

US 9,454,466 B2

EXPLAINING PARTIALLY ILLEGAL COMBINATIONS IN COMBINATORIAL MODELS

TECHNICAL FIELD

The present disclosure relates to testing in general, and to testing using combinatorial models, in particular.

BACKGROUND

A combinatorial model, also referred to as Cartesian-product model, is a set of attributes, values for the attributes (also referred to as domains), and restrictions on value combinations that may not appear together. Such a model spans a space of valid tests: each combination of values to the attributes that does not violate any restriction corresponds to a valid test. Each combination of attributes or a subset of attributes, which is excluded by one or more restrictions is referred to as an illegal combination.

Combinatorial models have a variety of usages. One such usage is functional coverage analysis of a System Under Test (SUT). Another usage is in Combinatorial Test Design (CTD). CTD is a test planning technique that selects a small subset of the valid test space that covers a predefined coverage goal. The coverage goal may define an interaction level of attributes that are to be covered, such as every n-wise combinations of values.

Preparing a combinatorial model may be a difficult task for a user, such as a verification engineer, a QA staff member, or the like. In particular, correctly capturing the restrictions over the model may be an important yet work-intensive and non-trivial task. Under-restricting the model may yield tests that cannot be executed and may cause coverage gaps if such tests are skipped or manually modified. Over-restricting the model also yields coverage gaps in the areas that are wrongly restricted.

BRIEF SUMMARY

One exemplary embodiment of the disclosed subject matter is a computer-implemented method comprising: obtaining a combinatorial model defining a legal test space, the combinatorial model comprising a set of attributes, a respective domain for each attribute defining possible values for the attribute, and a set of restrictions, wherein the restrictions define a combination of values of the attributes that are illegal and are excluded from the legal test case; obtaining a partially illegal combination defining value assignments to a portion of the attributes; automatically identifying, by a computer, an extension of the partially illegal combination, wherein the extension is excluded from the legal test space, wherein the extension can be modified to become legal by changing a portion of the value assignments defined by the partially illegal combination; and outputting the extension.

Another exemplary embodiment of the disclosed subject matter is a computerized apparatus having a processor, the processor being adapted to perform the steps of: obtaining a combinatorial model defining a legal test space, the combinatorial model comprising a set of attributes, a respective domain for each attribute defining possible values for the attribute, and a set of restrictions, wherein the restrictions define a combination of values of the attributes that are illegal and are excluded from the legal test case; obtaining a partially illegal combination defining value assignments to a portion of the attributes; automatically identifying an extension of the partially illegal combination, wherein the extension is excluded from the legal test space, wherein the extension can be modified to become legal by changing a portion of the value assignments defined by the partially illegal combination; and outputting the extension.

Yet another exemplary embodiment of the disclosed subject matter is a computer program product comprising a non-transitory computer readable medium retaining program instructions, which instructions when read by a processor, cause the processor to perform a method comprising: obtaining a combinatorial model defining a legal test space, the combinatorial model comprising a set of attributes, a respective domain for each attribute defining possible values for the attribute, and a set of restrictions, wherein the restrictions define a combination of values of the attributes that are illegal and are excluded from the legal test case; obtaining a partially illegal combination defining value assignments to a portion of the attributes; automatically identifying an extension of the partially illegal combination, wherein the extension is excluded from the legal test space, wherein the extension can be modified to become legal by changing a portion of the value assignments defined by the partially illegal combination; and outputting the extension.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
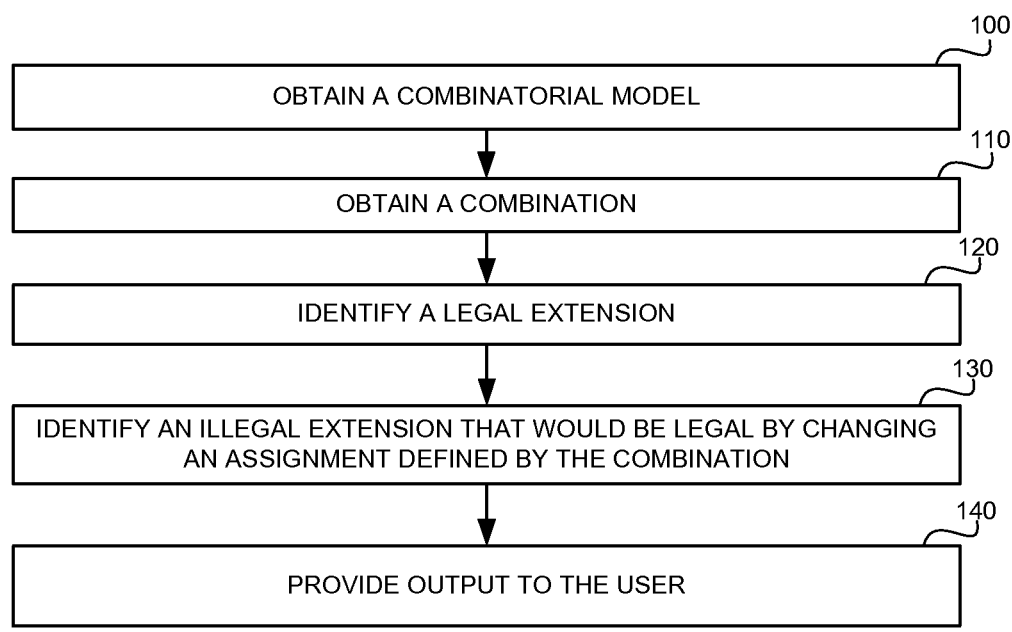
FIG. 1 shows a flowchart diagram of a method, in accordance with some exemplary embodiments of the disclosed subject matter.

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to assist the user to understand reasons for which a combination is partially illegal. Another technical problem is to provide proof to the user that the combination is partially illegal.

A combinatorial model defines a test space that is an aggregation of coverage tasks that can be tested. Each coverage task is a full assignment of values to a set of attributes. The assigned values are selected from a respective domain of each attribute. One or more coverage tasks may be restricted from the test space using a restriction. The restriction may define a partial assignment to the attributes that is restricted. As an example, in a model having four attributes A, B, C, D each being associated with a respective domain $D_A=\{a_1, a_2\}$, $D_B=\{b_1, b_2\}$, $D_C=\{c_1, c_2\}$, $D_D=\{d_1, d_2, d_3\}$. A restriction $A=a_1 \wedge B=b_1$ excludes from the test space all coverage tasks that assign the value of $a_1$ to A and the value $b_1$ to B.

A combination is an assignment of values to one or more attributes of the model. A full combination provides for a full assignment of values to the attributes (e.g., a full combination corresponds to a coverage task). For example, in the model defined above, a full combination may be ($A=a_1$, $B=b_1$, $C=c_1$, $D=d_1$) as it defines an assignment to each attribute of the model.

A partial combination provides a partial assignment of values to the attributes. For example, in the model defined above, a partial combination may be ($A=a_1$, $B=b_1$) as it only defines assignment of two out of the four attributes of the model (e.g., a partial combination corresponds to a plurality of coverage tasks). An extension of a partial combination is a combination which provides in addition to the partial assignment of the partial combination, also an assignment to additional attributes of the model. The extension may be a full combination or may be a partial combination in itself. ($A=a_1$, $B=b_1$, $C=c_1$, $D=d_1$) may be an extension of the partial combination defined above. Similarly, ($A=a_1$, $B=b_1$, $C=c_2$, $D=d_2$) may also be an extension of the same partial combination.

A combination is said to be an illegal combination, if every extension of the combination (or the combination itself, in case of a full combination) is restricted from the model by at least one restriction. For example, ($A=a_1$, $B=b_1$, $C=c_2$, $D=d_2$) may be an illegal combination as it is restricted by the restriction $A=a_1 \wedge B=b_1$. Similarly, the partial combination ($A=a_1$, $B=b_1$) is also an illegal combination as it is also restricted by the same restriction.

A combination is said to be partially illegal if the combination itself is not illegal (e.g., it has at least one extension that is not restricted from the model) and the combination also has an extension that is illegal (referred to as illegal extension) which can become legal if one or more of the assignments defined by the combination is changed. For example, in a model having the restrictions $A=a_1 \wedge B=b_1$, the combination ($A=a_1$, $D=d_1$) is partially illegal. This combination, by itself, is not illegal (e.g., one legal full extension is ($A=a_1$, $B=b_2$, $C=c_2$, $D=d_1$)). However, this combination has an illegal extension. For example: ($A=a_1$, $B=b_1$, $D=d_1$) is an extension that is excluded from the model by the restrictions and by changing the value assigned in the combination to A, the same extension (adding $B=b_1$) would become legal.

Intuitively one might say that a partially illegal combination is a combination that is "almost" illegal, as it involves some assignments that given some additional assignments would cause the combination to become illegal.

While partially illegal combinations are not by themselves excluded from the test space, marking them to the user, when reviewing combinations of values to certain subsets of attributes, may still be of value. The reason for this is that they may suggest to the user other combinations that are illegal, and may be wrongfully so. When the reviewer sees a combination that is partially illegal, he or she may ask themselves whether this combination should indeed be part of an excluded combination. If not, further investigation may be called for.

One technical solution provided by the disclosed subject matter is to automatically identify an illegal extension of a given partially illegal combination and identify a modification to the partially illegal combination that would render the illegal extension—legal.

The disclosed subject matter may explain the partial illegality of the combination by computing and presenting an extension of the combination that is illegal, such that a value change in the original combination will make it legal. The extension can either be to a full extension or a partial extension.

In some exemplary embodiments, Binary Decision Diagrams (BDDs) may be utilized in order to identify the illegal extension which can be made legal. A BDD may be used to encode a combinatorial model as is explained in US Patent Publication 2012/0324414 A1, entitled "BDD-BASED FUNCTIONAL MODELING", which is hereby incorporated by reference.

An extensions BDD may be used to encode all extensions of the combination that are illegal, by conjuncting a BDD encoding the combination and a BDD encoding all illegal combinations (e.g., a negation of the legal test-space (legal BDD)). The extensions BDD may be manipulated to include only the values not defined by the combination, such as by existing out the attributes appearing in the combination. The BDD that is determined as a result of such existing out operation is referred to as a completion BDD. The completion BDD may be conjuncted with a legal BDD representing the legal tasks (e.g., the legal test-space). The BDD that is determined as a result of such conjunction is referred to as a result BDD. Any satisfying assignment to the result BDD is an extension to the combination that is illegal, for which there exist an assignment to the attributes of the combination that makes the task legal. Therefore, an automatic process may select any assignment defined by the result BDD and present it to the user to prove that the combination is indeed a partially illegal combination.

In some exemplary embodiments, assuming the attribute set of the combination is small (e.g., below about ten attributes, as may be often the case), and the attributes have only a few values defined in their respective domains (as is also may be a common scenario), an automatic process can exhaustively check all possible assignments to find the closest one. Optionally, an exhaustive search may be performed if the number of attributes and the size of their domains is within predetermined threshold. If the threshold is not met, a greedy solution may be performed instead. Additionally or alternatively, a sample of the assignments defined by the result BDD may be obtained, thereby limiting the number of alternatives to check to a desired threshold, and an exhaustive search may be performed on the sample to pick the "best" example out of the sample.

In some exemplary embodiments, given a partially illegal combination, a satisfiability solver can search for an extension which is illegal and, optionally, provide an explanation for illegality, for example as is disclosed in the co-pending application by the same assignee which is filed concurrently, entitled "EXPLAINING ILLEGAL COMBINATIONS IN COMBINATORIAL MODELS", which is hereby incorporated by reference in its entirety. The satisfiability solver may also be utilized to search for a value change in the original combination that will make the extension legal (e.g., satisfiable).

In some exemplary embodiments, the satisfiability solver is a tool that determines if there exists an interpretation that satisfies a given satisfiability formula, such as a Boolean formula, a Constraint Satisfaction Problem (CSP), or the like. The satisfiability solver may be, for example, a Boolean Satisfiability Problem (SAT) Solver, a CSP solver, or the like.

In some exemplary embodiments, the solver may iterate over different possible extensions (possibly starting from extension size 1, 2, etc.). For each extension, the solver may determine whether the assignment defined by the extension is satisfiable given the restrictions of the model. Once unsatisfiability of such satisfiability problem is determined, an illegal extension is identified. The illegal extension may then be checked for satisfiability when the assignments defined by the combination are omitted. Additionally or alternatively, the determination may be performed by brute force enumeration which may yield a minimal change to the combination which would render the extension legal. A minimal change may be preferred as it may be a simpler explanation that may be more easily comprehended by a user.

Additionally or alternatively, BDDs may be used after identifying the illegal extension. The BDD may be set with the values defined by the extension and not by the combination and conjuncted with the legal BDD. Any assignment of such resulting BDD shows a modification to the combination that renders the illegal extension to become legal.

In another exemplary embodiment, a single satisfiability problem may be used to consider an extension to all attributes. This alternative may be easier to compute and potentially may be of a lower degree of computational complexity, however it may produce a less concise explanation. The entire computation (finding the illegal extension, and the value change to make it legal) can be performed in a single query to the solver.

Additionally or alternatively, given a partially illegal combination, and an extension of it that is illegal, the minimal value change to make the partially-legal legal can be also computed using BDDs, by defining a transition relation that changes exactly one value and performing symbolic steps from the illegal combination.

Reference is now made to FIG. 1 showing a flowchart diagram of a method performed by a computer, in accordance with some exemplary embodiments of the disclosed subject matter.

In Step 100, a combinatorial model is obtained. The model may be obtained from an electronic source, from a user, or from any other source.

In Step 110, a combination is obtained. The combination may be a partial combination. The combination may be provided by the user. In some exemplary embodiments, the user may provide combination that he knows to be partially illegal in the combinatorial model.

In Step 120, a legal extension of the combination is identified. The legal extension may be a full extension indicating that the combination is not illegal.

In Step 130, an illegal extension of the combination is identified. The illegal extension may add value assignments to attributes that are not assigned by the combination. The illegal extension may be characterized in becoming legal in case one or more of the values assigned by the combination itself were changed.

In Step 140, output is provided to the user. The output may exemplify to the user that the combination is not illegal by showing the legal extension identified in step 120. The output may exemplify to the user that the combination is partially illegal by showing the illegal extension of Step 130. In some exemplary embodiments, the output may indicate the illegal extension, may show which one or more restrictions render it illegal, and indicate a possible change in a value defined by the combination to render the extension legal. The output may be aimed at showing the user that the combination is indeed a partially illegal combination.

Figure 2A:
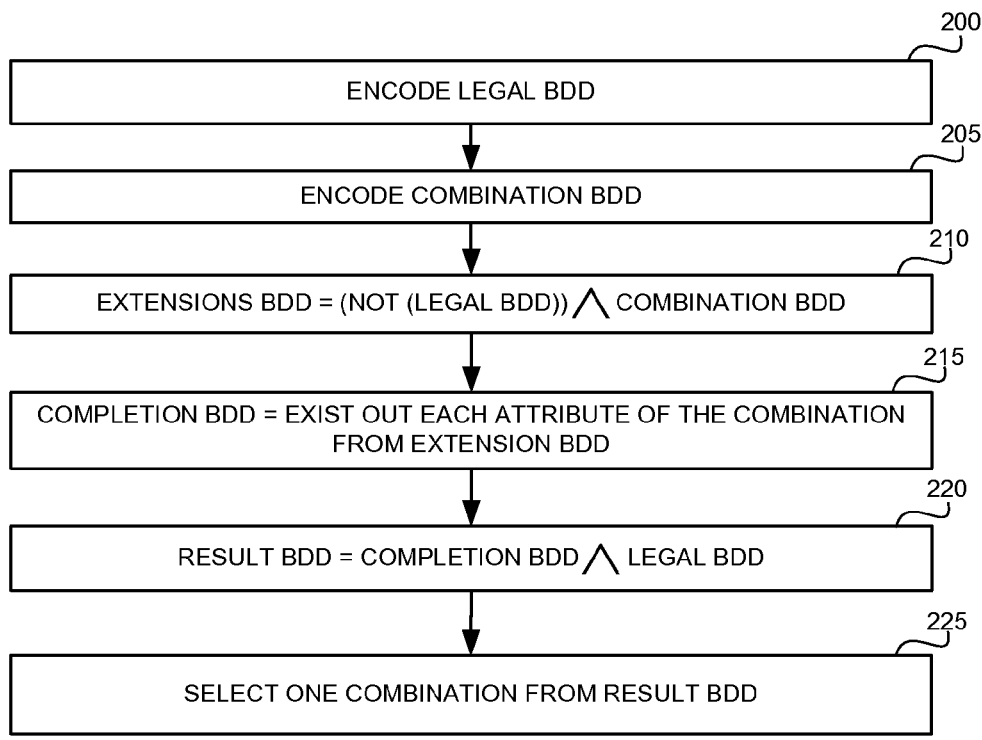
FIG. 2A shows a flowchart diagram of a method, in accordance with some exemplary embodiments of the disclosed subject matter.

Reference is now made to FIG. 2A showing a flowchart diagram of a method performed by a computer, in accordance with some exemplary embodiments of the disclosed subject matter. The method of 2A is an example of a BDD-based method.

In Step 200, a Legal BDD is encoded. The Legal BDD may be a BDD representing the entire legal test space. The Legal BDD may be defined, for example, based on a manipulation of the restrictions as defined by the combinatorial model (e.g., obtained in Step 100 of FIG. 1). It will be noted that though BDDs are used, the attributes may be of non-binary domain, and a plurality of BDD variables may be used to encode a single attribute. Hence, in some cases, some of the assignments to the BDD variables may be excluded not due the restrictions but rather due to the encoding of non-binary domain using binary variables.

In Step 205, the combination (e.g., obtained in Step 110 of FIG. 1) is encoded in a Combination BDD. The Combination BDD may represent assignments of values to attributes based on the combination.

In Step 210, an Extensions BDD may be computed. The Extensions BDD may be computed based on the Legal BDD and Combination BDD. In some exemplary embodiments, Extensions BDD may be computed as a conjunction between Combination BDD and a negation of the Legal BDD thereby representing all illegal extensions. In some exemplary embodiments, in case some combination of values are excluded due to encoding of non-binary domains using binary domains, the Extensions BDD may be manipulated to exclude combinations that do not correspond to valid values of the attributes. Additionally or alternatively, Extensions BDD may be computed by conjuncting the Combination BDD with a disjunction of BDDs, each of which corresponds to a restriction of the model.

In Step 215, a Completion BDD may be computed. The Completion BDD may include the possible assignments to other attributes that are not defined by the combination and that if added to the combination would render its extension as illegal. Completion BDD may be computed by taking the Extensions BDD and existing out from the Extensions BDD any attribute whose value is defined by the combination. For example, if the combination assigns values to two attributes: A and B, the Completion BDD may be computed by existing out the BDD variables that are associated with attributes A and B from the Extensions BDD.

In Step 220, the Completion BDD may be conjuncted with the Legal BDD to compute a Result BDD. The Result BDD may include all completions of the combinations which create an illegal extension but could create a legal extension if the combination was different.

In Step 225, one or more combination may be selected from the Result BDD. The selected combination may correspond to the illegal extension that is to be identified in Step 130.

In some exemplary embodiments, the selected combination may be a combination that requires a minimal change in the combination (e.g., preferably changing one assigned value defined by the combination, otherwise changing only two values, etc.). The selection may be performed by enumerating all combinations defined by the Result BDD and selecting a "best" combination out of them. Additionally or alternatively, the selection may be performed from a sample of the combinations defined by the Result BDD, such as in the case that the total number of combinations may be greater than a predetermined threshold.

Additionally or alternatively, BDD manipulations may be performed in order to select the combination in Step 225. As an example, a Transition Relation (TR) BDD may be defined to be useful in changing exactly one value in the combination. By conjuncting TR BDD with the Combination BDD, a group of combinations that are defined by a single change can be identified. Similarly, TR BDD may be conjuncted K times to include the group of combinations that are defined by exactly K changes in the combination. Such computed groups may be represented using BDDs and conjuncted iteratively with the Result BDD to find combinations that include exactly 1, 2, . . . , K changes in the combination.

Figure 2B:
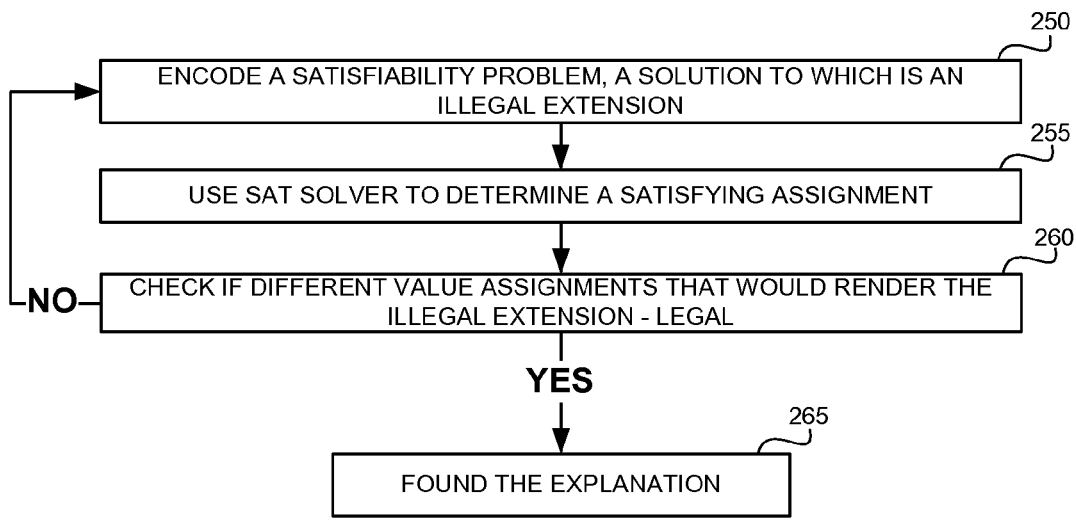
FIG. 2B shows a flowchart diagram of a method, in accordance with some exemplary embodiments of the disclosed subject matter.

Reference is now made to FIG. 2B showing a flowchart diagram of a method performed by a computer, in accordance with some exemplary embodiments of the disclosed subject matter. The method of FIG. 2B is an example of a method that uses a satisfiability problem solver, such as a SAT solver.

In Step 250, a satisfiability problem is encoded. The problem may encode an extension of the combination that is illegal, such as by conjuncting the constraints of the combination with a disjunction of the restrictions.

In Step 255, a solver, such as a SAT solver, may be utilized to determine a satisfying assignment.

In Step 260, the assignment of Step 255 is checked to determine whether or not it can be modified by changing one or more value assignments defined by the combination in order to become valid. Different methods may be used in order to check this, such as but not limited to BDD-based or SAT-based methods.

If an assignment is found in Step 260, the assignment may be used for the explanation (Step 265). If no such assignment is found, a different satisfying assignment may be obtained from the solver (Step 255). In some exemplary embodiments, a new satisfiability problem may be encoded to exclude the assignment from being a solution (Step 250)

Figure 3:
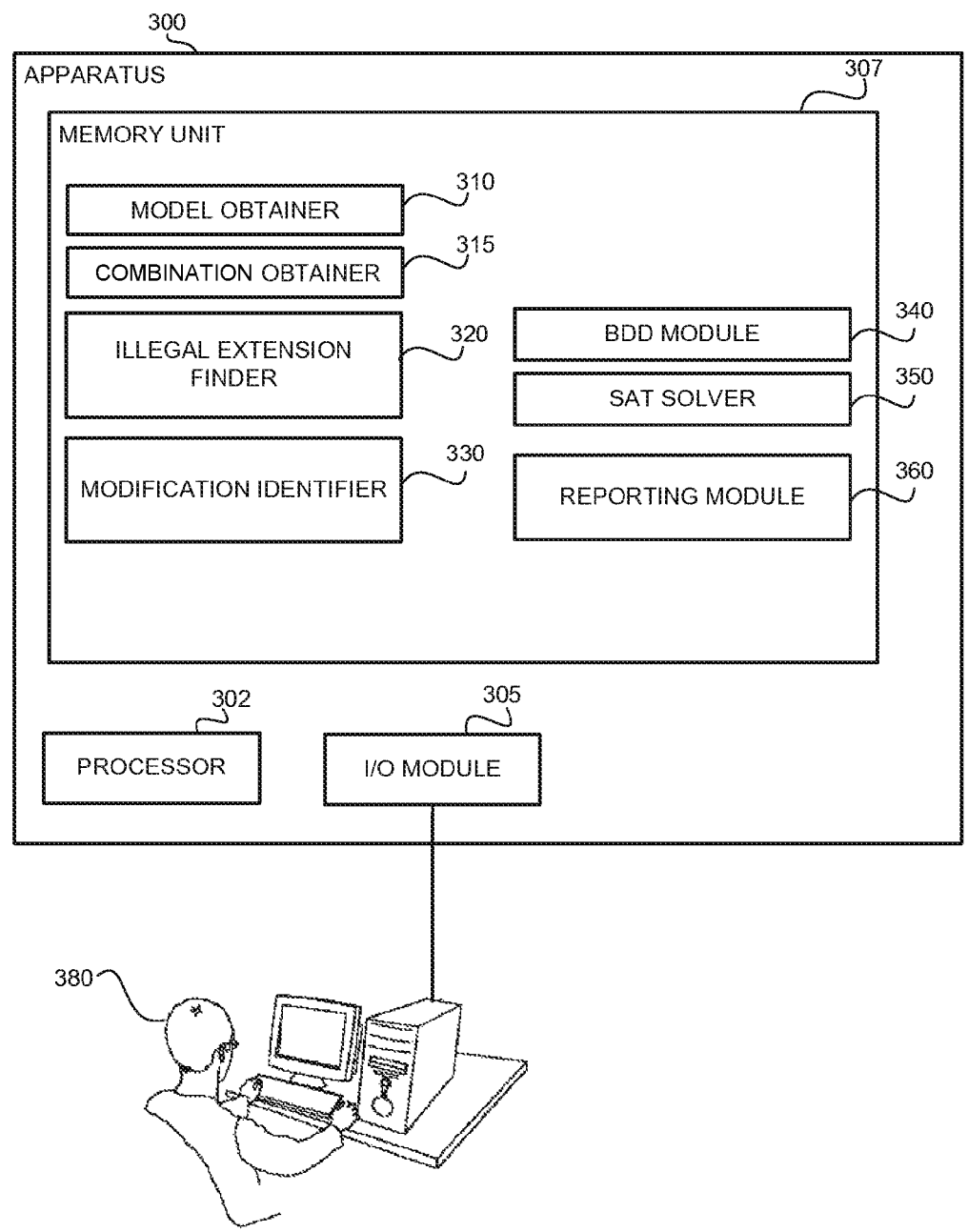
FIG. 3 shows a block diagram of an apparatus, in accordance with some exemplary embodiments of the disclosed subject matter.

Referring now to FIG. 3 showing a block diagram of components of an apparatus, in accordance with some exemplary embodiments of the disclosed subject matter. An apparatus 300 may be a computerized apparatus adapted to perform methods such as depicted in FIGS. 1, 2A and/or 2B.

In some exemplary embodiments, Apparatus 300 may comprise a Processor 302. Processor 302 may be a Central Processing Unit (CPU), a microprocessor, an electronic circuit, an Integrated Circuit (IC) or the like. Alternatively, Apparatus 300 can be implemented as firmware written for or ported to a specific processor such as Digital Signal Processor (DSP) or microcontrollers, or can be implemented as hardware or configurable hardware such as field programmable gate array (FPGA) or application specific integrated circuit (ASIC). Processor 302 may be utilized to perform computations required by Apparatus 300 or any of it sub-components.

In some exemplary embodiments of the disclosed subject matter, Apparatus 300 may comprise an Input/Output (I/O) Module 305 such as a terminal, a display, a keyboard, an input device or the like to interact with the system, to invoke the system and to receive results. It will however be appreciated that the system can operate without human operation.

In some exemplary embodiments, the I/O Module 205 may be utilized to provide an interface to a User 380 to interact with Apparatus 300, such as by providing the combinatorial model, by modifying the model, by providing a combination, by viewing output provided by Apparatus 300, or the like.

In some exemplary embodiments, Apparatus 300 may comprise a Memory Unit 307. Memory Unit 307 may be persistent or volatile. For example, Memory Unit 307 can be a Flash disk, a Random Access Memory (RAM), a memory chip, an optical storage device such as a CD, a DVD, or a laser disk; a magnetic storage device such as a tape, a hard disk, storage area network (SAN), a network attached storage (NAS), or others; a semiconductor storage device such as Flash device, memory stick, or the like. In some exemplary embodiments, Memory Unit 307 may retain program code operative to cause Processor 302 to perform acts associated with any of the steps shown in FIGS. 1, 2A and/or 2B.

The components detailed below may be implemented as one or more sets of interrelated computer instructions, executed for example by Processor 302 or by another processor. The components may be arranged as one or more executable files, dynamic libraries, static libraries, methods, functions, services, or the like, programmed in any programming language and under any computing environment.

A Model Obtainer 310 may be configured to obtain a combinatorial model, such as from a computer-readable medium and/or from User 380. Similarly, Combination Obtainer 315 may be configured to obtain a combination from a computer-readable medium and/or from User 380. The obtained combination may be a partially illegal combination.

Illegal Extension Finder 320 may be configured to identify an extension of the combination that is illegal by itself. A modification to the illegal extension in a value define by the combination, and which renders the illegal extension legal may be identified by Modification Identifier 330. In some exemplary embodiments, Illegal Extension Finder 320 and Modification Identifier 330 may be implemented in a single module. These components may also be implemented to determine groups of illegal extensions and/or modifications, such as the case when utilizing BDDs.

Illegal Extension Finder 320 and Modification Identifier 330 may be operatively coupled to BDD Module 340 and/or SAT Solver 350.

BDD Module 340 may be configured to encode combinations using BDDs. The BDDs may utilize BDD variables to encode the attributes. BDD Module 340 may be configured to manipulate BDDs such as by encoding BDDs, conjuncting BDDs, disjuncting BDDs, performing "exist out" operation on BDDs, negating BDDs or the like.

SAT Solver 350 may be configured to determine satisfiability or unsatisfiability of a satisfiability problem.

A Reporting Module 360 may be utilized to present output to User 380. The output may provide an explanation to User 380 as to why the combination is considered a partially illegal combination.

In some exemplary embodiments, User 380 may utilize a User Interface (UI) in which partially illegal combinations are indicated. The user may select, such as using a keyboard, a pointing device, or the like, a partially illegal combination for which he would like to receive an explanation as to its legality. In response to such a selection, Combination Obtainer 315 may obtain the selected combination and Apparatus 300 may implement its functionality to provide an output to User 380.

Figure 4:
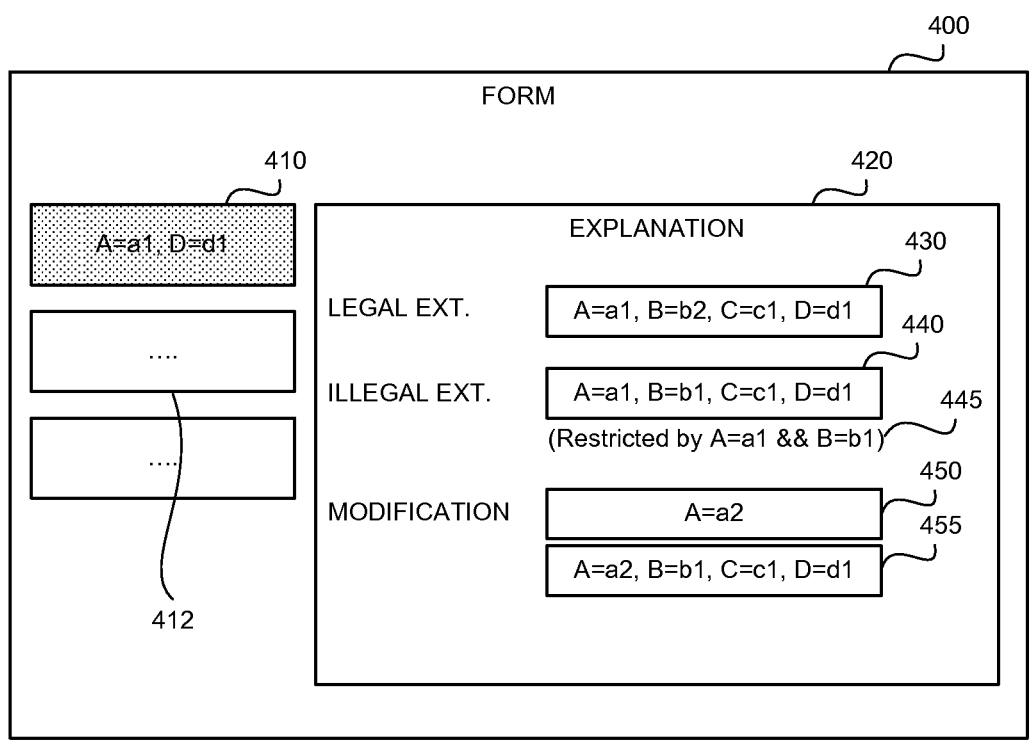
FIG. 4 shows an illustration of a form, in accordance with some exemplary embodiments of the disclosed subject matter.

Reference is now made to FIG. 4 which shows an illustration of a form, in accordance with some exemplary embodiments of the disclosed subject matter. Form 400 is an example of an output which may be provided to the user (e.g., in Step 140, by Reporting Module 360, or the like).

Form 400 may include a List of Combinations 412. Optionally, List of Combinations 412 only includes partially illegal combinations, such as Combination 410. In some exemplary embodiments, Form 400 may be a static report such as can be printed out. Additionally or alternatively, Form 400 may be an interactive UI component that is responsive to user input, such as selection of a combination from the List 412. In response to a selection, Explanation 420 is displayed with respect to the selected combination.

Explanation 420 may include a Legal Extension 430 explaining why the combination is not an illegal combination.

Additionally or alternatively, Explanation 420 may also include an Illegal Extension 440, which renders the combination a partially illegal combination. In some exemplary embodiments, an Exclusion Explanation 445 may provide an explanation as to the exclusion of the Illegal Extension 440, such as indicating which one or more restrictions of the model exclude the illegal extension from the model.

Additionally or alternatively, a Modification Information 450 may indicate a modification to Illegal Extension 440 which would render it legal. The modification is in one or more attribute whose value is defined by the selected combination (e.g., Combination 410).

Additionally or alternatively, a Modified Combination 455 may be presented implemented on Illegal Extension 440 the modification indicated by Modification Information 450.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
    obtaining, by a computer, a combinatorial model for functional coverage analysis of a system under test, the combinatorial model defining a legal test space that is an aggregation of coverage tasks that can be tested, the combinatorial model comprising a set of attributes, a respective domain for each attribute defining possible values for the attribute, and a set of restrictions, wherein the restrictions define a combination of values of the attributes that are illegal and are excluded from the legal test space;
    obtaining, by the computer, a partially illegal combination defining value assignments to a portion of the attributes;
    automatically identifying, by the computer, an extension of the partially illegal combination and a modification that will render the extension legal,
        wherein the extension is excluded from the legal test space,
        wherein the modification changes a portion of the value assignments defined by the partially illegal combination,
        wherein the automatically identifying comprises utilizing a Binary Decision Diagram (BDD), and
        wherein the utilizing of the BDD comprises:
            encoding a first BDD representing all extensions of the partially illegal combination that are excluded from the legal test space;
            existing out from the first BDD all BDD variables that correspond to the portion of the attributes to which the partially illegal combination assigns values to compute a second BDD; and
            conjuncting the second BDD with the legal test space to compute a third BDD; and
    outputting, by the computer, an indication of the extension and the modification.

2. The computer-implemented method of claim 1, wherein said utilizing the BDD further comprises: selecting one combination defined by the third BDD, and wherein the one combination that is selected corresponds to the extension.

3. The computer-implemented method of claim 1, wherein said automatically identifying comprises utilizing a satisfiability problem solver to identify the extension.

4. The computer-implemented method of claim 1, wherein said automatically identifying comprises selecting from a group of candidate extensions an extension that is associated with a minimal modification of the partially illegal combination in order to become legal.

5. A computerized apparatus comprising:
    a processor adapted to perform the steps of:
        obtaining a combinatorial model for functional coverage analysis of a system under test, the combinatorial model defining a legal test space that is an aggregation of coverage tasks that can be tested, the combinatorial model comprising a set of attributes, a respective domain for each attribute defining possible values for the attribute, and a set of restrictions, wherein the restrictions define a combination of values of the attributes that are illegal and are excluded from the legal test space;
        obtaining a partially illegal combination defining value assignments to a portion of the attributes;
        automatically identifying an extension of the partially illegal combination and a modification that would render the extension legal,
            wherein the extension is excluded from the legal test space,
            wherein the modification changes a portion of the value assignments defined by the partially illegal combination,
            wherein the automatically identifying comprises utilizing a Binary Decision Diagram (BDD), and
            wherein the utilizing of the BDD comprises:
                encoding a first BDD representing all extensions of the partially illegal combination that are excluded from the legal test space;
                existing out from the first BDD all BDD variables that correspond to the portion of the attributes to which the partially illegal combination assigns values to compute a second BDD; and
                conjuncting the second BDD with the legal test space to compute a third BDD; and
    a user interface operably connected to the processor, the user interface outputting an indication of the extension and the modification.

6. The computerized apparatus of claim 5, wherein said utilizing the BDD further comprises: selecting one combination defined by the third BDD, wherein the one combination that is selected corresponds to the extension.

7. The computerized apparatus of claim 5, wherein said automatically identifying comprises utilizing a satisfiability problem solver to identify the extension.

8. The computerized apparatus of claim 5, wherein said automatically identifying comprises selecting from a group of candidate extensions an extension that is associated with a minimal modification of the partially illegal combination in order to become legal.

9. A computer program product comprising a non-transitory computer readable medium retaining program instructions, which instructions when read by a processor, cause the processor to perform a method comprising:
  obtaining a combinatorial model for functional coverage analysis of a system under test, the combinatorial model defining a legal test space that is an aggregation of coverage tasks that can be tested, the combinatorial model comprising a set of attributes, a respective domain for each attribute defining possible values for the attribute, and a set of restrictions, wherein the restrictions define a combination of values of the attributes that are illegal and are excluded from the legal test space;
  obtaining a partially illegal combination defining value assignments to a portion of the attributes;
  automatically identifying an extension of the partially illegal combination and a modification that would render the extension legal,
    wherein the extension is excluded from the legal test space,
    wherein the modification changes a portion of the value assignments defined by the partially illegal combination,
  wherein the automatically identifying comprises utilizing a Binary Decision Diagram (BDD) to identify the extension, and
  wherein the utilizing of the BDD comprises:
    encoding a first BDD representing all extensions of the partially illegal combination that are excluded from the legal test space;
    existing out from the first BDD all BDD variables that correspond to the portion of the attributes to which the partially illegal combination assigns values to compute a second BDD; and
    conjuncting the second BDD with the legal test space to compute a third BDD; and
  outputting an indication of the extension and the modification.

* * * * *